(12) United States Patent
Rouse et al.

(10) Patent No.: US 7,790,561 B2
(45) Date of Patent: Sep. 7, 2010

(54) GATE SIDEWALL SPACER AND METHOD OF MANUFACTURE THEREFOR

(75) Inventors: Richard P. Rouse, Dallas, TX (US); Shashank S. Ekbote, Allen, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 283 days.

(21) Appl. No.: 11/173,088

(22) Filed: Jul. 1, 2005

(65) Prior Publication Data

US 2007/0004156 A1   Jan. 4, 2007

(51) Int. Cl.
*H01L 21/336* (2006.01)

(52) U.S. Cl. .................... 438/299; 438/199; 438/218; 257/69; 257/204; 257/206; 257/351; 257/E21.632; 257/E27.046; 257/E27.064; 257/E27.108

(58) Field of Classification Search ................. 438/299
See application file for complete search history.

(56) References Cited

U.S. PATENT DOCUMENTS

| | | | | |
|---|---|---|---|---|
| 5,500,379 A * | 3/1996 | Odake et al. | ............. | 438/217 |
| 5,757,045 A * | 5/1998 | Tsai et al. | ............. | 257/336 |
| 6,083,836 A * | 7/2000 | Rodder | ............. | 438/690 |
| 6,294,415 B1 * | 9/2001 | Tseng et al. | ............. | 438/197 |
| 6,372,672 B1 * | 4/2002 | Kim et al. | ............. | 438/791 |
| 6,740,605 B1 * | 5/2004 | Shiraiwa et al. | ............. | 438/795 |
| 6,743,291 B2 * | 6/2004 | Ang et al. | ............. | 117/90 |
| 6,864,143 B1 * | 3/2005 | Shue et al. | ............. | 438/299 |
| 6,905,982 B2 * | 6/2005 | Sato et al. | ............. | 438/792 |
| 6,930,007 B2 * | 8/2005 | Bu et al. | ............. | 438/289 |
| 6,949,481 B1 * | 9/2005 | Halliyal et al. | ............. | 438/795 |
| 6,955,965 B1 * | 10/2005 | Halliyal et al. | ............. | 438/257 |
| 6,992,370 B1 * | 1/2006 | Kluth et al. | ............. | 257/640 |
| 7,098,099 B1 * | 8/2006 | Hornung et al. | ............. | 438/229 |
| 7,163,860 B1 * | 1/2007 | Kamal et al. | ............. | 438/257 |
| 2002/0042211 A1 * | 4/2002 | Tanabe et al. | ............. | 438/795 |
| 2004/0043549 A1 * | 3/2004 | Sayama et al. | ............. | 438/197 |
| 2004/0087155 A1 * | 5/2004 | Wieczorek et al. | ............. | 438/689 |
| 2004/0097100 A1 * | 5/2004 | Sato et al. | ............. | 438/778 |
| 2004/0110392 A1 * | 6/2004 | Fu et al. | ............. | 438/778 |
| 2004/0124476 A1 * | 7/2004 | Miyano | ............. | 257/371 |
| 2004/0127005 A1 * | 7/2004 | Lee et al. | ............. | 438/595 |

(Continued)

OTHER PUBLICATIONS http://en.wikipedia.org/wiki/PECVD.*

*Primary Examiner*—Fernando L Toledo
*Assistant Examiner*—Ankush k Singal
(74) *Attorney, Agent, or Firm*—John J. Patti; Wade J. Brady, III; Frederick J. Telecky, Jr.

(57) ABSTRACT

The present invention provides a method for manufacturing a semiconductor device, a semiconductor device, and a method for manufacturing an integrated circuit including a semiconductor device. The method for manufacturing the semiconductor device, without limitation, may include providing a gate dielectric layer (413, 423) and a gate electrode layer (418, 428) over a substrate (310), and forming a gate sidewall spacer (610, 630) along one or more sidewalls of the gate dielectric layer (413, 423) and the gate electrode layer (418, 428) using a plasma enhanced chemical vapor deposition process, and forming different hydrogen concentration in NMOS and PMOS sidewall spacers (610, 630) using a local hydrogen treatment (LHT) method.

20 Claims, 6 Drawing Sheets

U.S. PATENT DOCUMENTS

| | | | |
|---|---|---|---|
| 2004/0150052 A1* | 8/2004 | Riccardi et al. | 257/369 |
| 2004/0164344 A1* | 8/2004 | Weimer | 257/321 |
| 2004/0224517 A1* | 11/2004 | Sugiyama et al. | 438/689 |
| 2005/0095765 A1* | 5/2005 | Saiki et al. | 438/197 |
| 2005/0104095 A1* | 5/2005 | Ng et al. | 257/284 |
| 2005/0153498 A1* | 7/2005 | Kim | 438/197 |
| 2005/0221562 A1* | 10/2005 | Yoshida et al. | 438/261 |
| 2005/0266622 A1* | 12/2005 | Arghavani et al. | 438/197 |
| 2005/0266631 A1* | 12/2005 | Kim et al. | 438/216 |
| 2006/0014351 A1* | 1/2006 | Lo et al. | 438/305 |
| 2006/0019455 A1* | 1/2006 | Bu et al. | 438/303 |
| 2006/0019456 A1* | 1/2006 | Bu et al. | 438/303 |
| 2006/0099765 A1* | 5/2006 | Yang | 438/301 |
| 2006/0121681 A1* | 6/2006 | Nandakumar | 438/302 |
| 2006/0205169 A1* | 9/2006 | Yoon et al. | 438/303 |
| 2006/0261420 A1* | 11/2006 | Saiki | 257/410 |
| 2007/0029608 A1* | 2/2007 | Huang | 257/327 |
| 2007/0072381 A1* | 3/2007 | Furuhashi et al. | 438/303 |

* cited by examiner

GATE SIDEWALL SPACER AND METHOD OF MANUFACTURE THEREFOR

TECHNICAL FIELD OF THE INVENTION

The present invention is directed, in general, to a gate sidewall spacer and, more specifically, to a novel gate sidewall spacer having an elevated amount of hydrogen therein, a method of manufacture therefore, and a method for manufacturing an integrated circuit including the same.

BACKGROUND OF THE INVENTION

There exists a continuing need to improve semiconductor device performance and further scale semiconductor devices. A characteristic that limits scalability and device performance is electron and hole mobility, also referred to as channel mobility, throughout the channel region of transistors. As devices continue to shrink in size, the channel region for transistors continues to also shrink in size, which can limit channel mobility.

One technique that may improve scaling limits and device performance is to introduce strain into the channel region, which can improve electron and hole mobility. Different types of strain, including expansive strain, uniaxial tensile strain, and compressive strain, have been introduced into channel regions of various types of transistors in order to determine their affect on electron and/or hole mobility. For some devices, certain types of strain improve mobility whereas other types degrade mobility.

Turning briefly to FIG. 1 illustrated is a cross-sectional view of a semiconductor device 100 at a stage of fabrication wherein a tensile stress is introduced by a conventional cap-annealing process. The semiconductor device 100, which happens to be an n-channel metal oxide semiconductor (NMOS) device, includes a substrate 110 having a well region 120 located therein. The semiconductor device 100 of FIG. 1 further includes a gate structure 130 located over the substrate 110. The gate structure 130, as appreciated, includes both a gate dielectric layer 133 and a gate electrode layer 138.

Positioned on both sides of the gate structure 130 are source/drain sidewall spacers 140. The source/drain sidewall spacers 140 illustrated in FIG. 1 each include only a single sidewall spacer. Positioned in the substrate 110 proximate the gate structure 130 are source/drain regions 150. The source/drain regions 150 therefore define a channel region 160 in the substrate 110.

After the source/drain regions 150 have been formed by implanting a suitable dopant, such as arsenic in the instant case, a stress-inducing layer 170 is deposited over the substrate 110 and gate structure 130. Among other processes, a chemical vapor deposition (CVD) process could be used to form the stress-inducing layer 170. Generally, the temperature of the deposition should be lower than the phase transition temperature of amorphous silicon. Then, a rapid thermal anneal is performed at a relatively high temperature, introducing and locking stress 180a, 180b into the channel region 160. The stress-inducing layer 170 is then removed and silicide regions (not shown) are typically formed on the source/drain regions 150 and gate electrode layer 138. A suitable silicide process is a conventional cobalt, nickel or other similar metal salicide process.

Compressive stress from the gate electrode layer 138 is enhanced by the annealing process described above, which introduces tensile stress 180a, 180b across the channel region 160. This tensile stress 180a, 180b can improve the performance of the semiconductor device 100 by improving hole and electron mobility in the channel region 160. The cap-annealing process described supra can show improvement for, among others, NMOS devices.

Unfortunately, it has been observed that the aforementioned process is unable to easily and accurately tune the stresses 180a, 180b within the channel region 160. Moreover, it has been observed that the stresses 180a, 180b are generally detrimental to the channel mobility of p-channel metal oxide semiconductor (PMOS) devices. Furthermore, because of the manufacturing processes used to form the stress-inducing layer 170, it is difficult to form such a layer only over the NMOS devices. The aforementioned process also introduces more process steps which increase the cost of manufacturing.

Accordingly, what is needed in the art is an improved method for manufacturing a semiconductor device, and a device manufactured using that method, that does not experience the aforementioned problems.

SUMMARY OF THE INVENTION

To address the above-discussed deficiencies of the prior art, the present invention provides a method for manufacturing a semiconductor device, a semiconductor device, and a method for manufacturing an integrated circuit including a semiconductor device. The method for manufacturing the semiconductor device, without limitation, may include providing a gate dielectric layer and a gate electrode layer over a substrate, and forming a gate sidewall spacer along one or more sidewalls of the gate dielectric layer and gate electrode layer using a plasma enhanced chemical vapor deposition process. Nevertheless, another embodiment of the invention, again without limitation, may include providing a gate structure having a gate dielectric layer, a gate electrode layer and a gate sidewall spacer over a substrate, wherein the gate sidewall spacer has an amount of hydrogen therein, and subjecting the gate sidewall spacer to an energy source, the gate sidewall spacer having less than the amount of hydrogen therein after being subjected to the energy source.

As previously indicated, the present invention also provides a semiconductor device. The semiconductor device, among other features, may include a gate dielectric layer and a gate electrode layer located over a substrate, and a gate sidewall spacer located along one or more sidewalls of the gate dielectric layer and gate electrode layer, the gate sidewall spacer containing 20 atomic percent or more of hydrogen therein. In one embodiment this is performed selectively for NMOS devices by using "local hydrogen treatment (LHT)". In addition to the method for manufacturing the semiconductor device and the semiconductor device, the present invention also provides a method for manufacturing an integrated circuit. This method may include forming a semiconductor device as disclosed above, and then forming dielectric layers over the semiconductor device, the dielectric layers having interconnects therein for contacting the semiconductor device and forming an integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention.

Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 1:
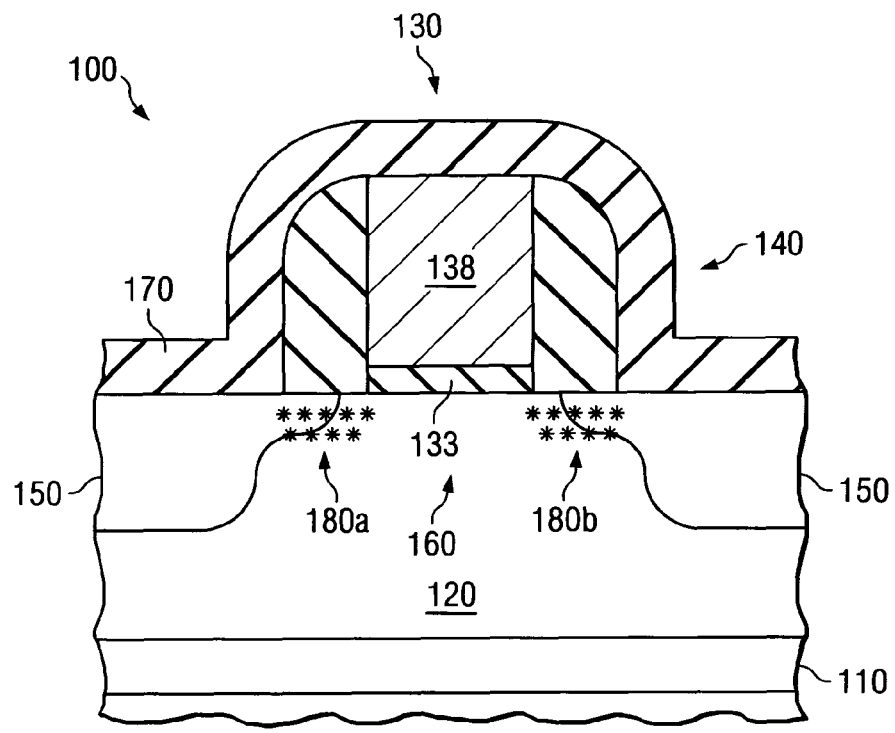
FIG. 1 illustrates a cross-sectional view of a semiconductor device at a stage of fabrication wherein a tensile stress is introduced by a conventional cap-annealing process.
Figure 2:
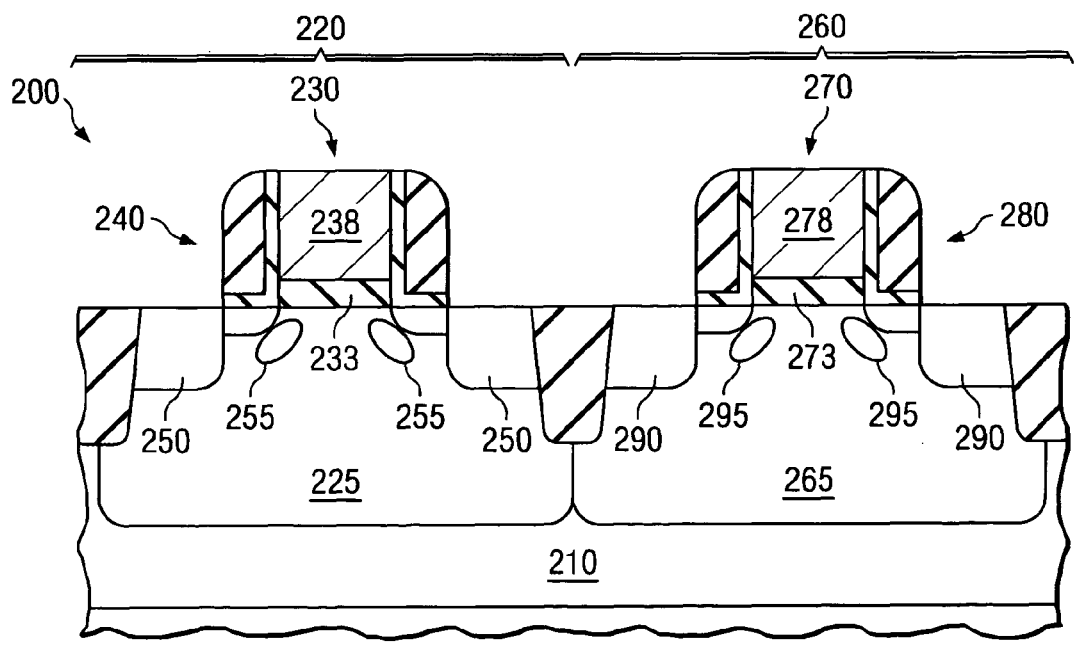
FIG. 2 illustrates a cross-sectional view of one embodiment of a semiconductor device constructed according to the principles of the present invention.

Referring initially to FIG. 2, illustrated is a cross-sectional view of one embodiment of a semiconductor device 200 constructed according to the principles of the present invention. In the embodiment illustrated in FIG. 2, the semiconductor device 200 includes a substrate 210. Located over or in the substrate 210 may be an n-channel metal oxide semiconductor (NMOS) device 220 and/or a p-channel metal oxide semiconductor (PMOS) device 260. While both the NMOS device 220 and the PMOS device 260 are illustrated in the embodiment of FIG. 2, the semiconductor device 200 could just as easily be manufactured having just the NMOS device 220 or PMOS device 260. Just the same, other embodiments exist wherein the semiconductor device 200 includes multiple NMOS devices 220 and/or multiple PMOS devices 260.

The NMOS device 220, in the given embodiment of FIG. 2, includes a well region 225 located within the substrate 210. The well region 225, as would be expected, comprises a p-type dopant, such as boron. Additionally, located over the substrate 210 and well region 225 is a gate structure 230. The gate structure 230 illustrated in FIG. 2 includes a gate dielectric layer 233 located over the substrate 210, as well as a gate electrode layer 238 located over the gate dielectric layer 233.

Formed on one or more sides of the gate dielectric layer 233 and gate electrode layer 238, and in this embodiment on both sides, are one or more gate sidewall spacers 240. The gate sidewall spacers 240, in accordance with the principles of the present invention, contain 20 atomic percent or more of hydrogen therein. For example, in one exemplary embodiment, the gate sidewall spacers 240 of the NMOS device 220 contain from about 25 atomic percent to about 30 atomic percent of hydrogen therein. The gate sidewall spacers 240, as compared to traditional gate sidewall spacers having substantially less than 15 atomic percent of hydrogen therein, are believed to also have elevated levels of tensile stress. For example, the gate sidewall spacers 240 may have tensile stress values of about 500 MPa or more, among others. These stresses are typically transferred to the channel region of the NMOS device 220.

The NMOS device 220 illustrated in FIG. 2 further includes conventional source/drain regions 250 located within the substrate 210. The source/drain regions 250, as is common, comprise an n-type dopant such as phosphorous and each includes a source/drain extension implant as well as a source/drain implant. Located proximate the source/drain regions 250 may be halo/pocket implants 255. As is common in the art, the halo/pocket implants 255 comprise an opposite type dopant to the source/drain regions 250. Accordingly, in the embodiment of FIG. 2, the halo/pocket implants 255 comprise a p-type dopant such as boron.

The PMOS device 260 on the other hand, in the given embodiment of FIG. 2, includes a well region 265 located within the substrate 210. The well region 265, as would be expected, comprises an n-type dopant, such as phosphorous. Additionally, located over the substrate 210 and well region 265 in the PMOS device 260 is a gate structure 270. The gate structure 270 illustrated in FIG. 2 includes a gate dielectric layer 273 located over the substrate 210, as well as a gate electrode layer 278 located over the gate dielectric layer 273.

Formed on one or more sides of the gate dielectric layer 273 and gate electrode layer 278, and in this embodiment again on both sides, are one or more gate sidewall spacers 280. The gate sidewall spacers 280, in accordance with the principles of the present invention and in contrast to the gate sidewall spacers 240, contain substantially less than 15 atomic percent of hydrogen therein. For example, in one exemplary embodiment, the gate sidewall spacers 280 of the PMOS device 260 contain from about 5 atomic percent to about 10 atomic percent of hydrogen therein. The decreased amount of hydrogen, as compared to the gate sidewall spacers 240, is believed to provide reduced levels of the change in stress in the sidewall spacer film upon dopant activation or anneal, if any. For example, the gate sidewall spacers 280 may have stress change values of about 300 MPa or less, among others. In contrast, the stress change in the high hydrogen sidewall spacers is typically about 500 MPa or more when subjected to the same anneal.

The PMOS device 260 illustrated in FIG. 2 further includes conventional source/drain regions 290 located within the substrate 210. The source/drain regions 290, as is common, comprise a p-type dopant such as boron and each include a source/drain extension implant as well as a source/drain implant. Located proximate the source/drain regions 290 may be halo/pocket implants 295. As is common in the art, the halo/pocket implants 295 comprise an opposite type dopant to the source/drain regions 290. Accordingly, in the embodiment of FIG. 2, the halo/pocket implants 295 comprise an n-type dopant such as phosphorous or arsenic.

Unique to the present invention, the increased levels of hydrogen within the gate sidewall spacers 240 provide increased change in the tensile stress within the channel region of the NMOS device 220 upon dopant activation anneal. However, as compared to traditional cap layers that introduce the tensile stress within the channel region, the hydrogen content in the gate sidewall spacers 240 may be tailored locally for NMOS and PMOS devices respectively without adding extra lithography masks by using "local hydrogen treatment (LHT)" method. Accordingly, the tensile stress may be customized to attain a desired and improved drive current in the NMOS device 220. Moreover, the hydrogen in the gate sidewall spacers 240 somewhat attracts boron used in the halo/pocket implant in the NMOS device 220. Accordingly, it tends to cause boron to segregate out of the interface between the gate dielectric layer 233 and the channel region, thereby reducing the boron pile-up at the interface and providing a retrograde pocket junction profile. The retrograde pocket junction, in turn, provides improved electron mobility, threshold voltage (Vt) roll-off and drain induced barrier loading (DIBL), which is the threshold voltage (Vt) of the NMOS device 220 in the linear region minus the threshold voltage (Vt) of the NMOS device 220 in the saturation region.

On the other hand, the lower levels of hydrogen within the gate sidewall spacers 280 provide reduced change in tensile stress in the sidewall spacer film, and therefore reduced stress within the channel region of the PMOS device 260 upon dopant activation anneal. As tensile stress within the channel region of PMOS devices reduces its drive current it is desirable to minimize the tensile stress for PMOS device. Moreover, the lower levels of hydrogen minimize the segregation of the boron out of the source/drain regions 290 of the PMOS device 260, and thereby the degradation of the drive current is reduced.

Figure 3:
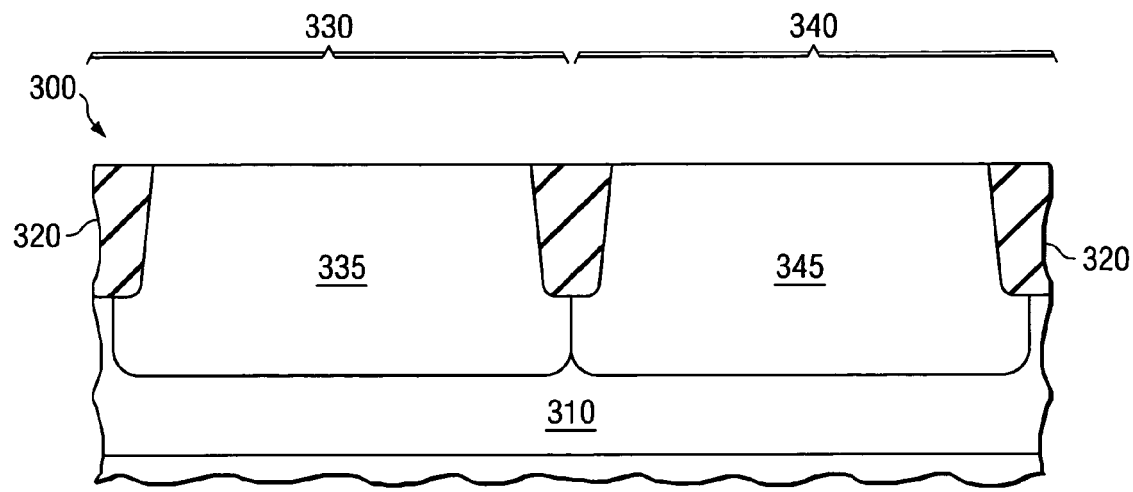
FIG. 3 illustrates a cross-sectional view of a partially completed semiconductor device.

Turning now to FIGS. 3-10, illustrated are cross-sectional views of detailed manufacturing steps instructing how one might, in an advantageous embodiment, manufacture a semiconductor device similar to the semiconductor device 200 depicted in FIG. 2. FIG. 3 illustrates a cross-sectional view of a partially completed semiconductor device 300. The partially completed semiconductor device 300 of FIG. 3 includes a substrate 310. The substrate 310 may, in an exemplary embodiment, be any layer located in the partially completed semiconductor device 300, including a wafer itself or a layer located above the wafer (e.g., epitaxial layer). In the embodiment illustrated in FIG. 3, the substrate 310 is a p-type semiconductor substrate; however, one skilled in the art understands that the substrate 310 could be an n-type substrate without departing from the scope of the present invention. In such a case, each of the dopant types described throughout the remainder of this document could be reversed. For clarity, no further reference to this opposite scheme will be discussed.

Located within the substrate 310 in the embodiment shown in FIG. 3 are isolation regions 320, such as shallow trench isolation regions. The isolation regions 320 isolate the semiconductor device 300 from other devices located proximate thereto, as well as isolate various portions of the semiconductor device 300 from each other. As those skilled in the art understand the various steps used to form these conventional isolation regions 320, no further detail will be given.

As is illustrated in FIG. 3, the isolation regions help define an NMOS device 330 and a PMOS device 340. Located within the substrate 310 in the NMOS device 330 is a well region 335. The well region 335, in light of the NMOS device 330, would more than likely contain a p-type dopant. For example, the well region 335 would likely be doped with a p-type dopant dose ranging from about 1E13 atoms/cm$^2$ to about 1E14 atoms/cm$^2$ and at a power ranging from about 100 kev to about 500 keV. What generally results is the well region 335 having a peak dopant concentration ranging from about 5E17 atoms/cm$^3$ to about 1E19 atoms/cm$^3$. Certain embodiments may also exist wherein the substrate 310 is used as the well region 335 for the NMOS device 330.

Located within the substrate 310 in the PMOS device 340 is a well region 345. The well region 345, in light of the PMOS device 340, would more than likely contain an n-type dopant. For example, the well region 345 would likely be doped with an n-type dopant dose ranging from about 1E13 atoms/cm$^2$ to about 1E14 atoms/cm$^2$ and at a power ranging from about 100 keV to about 500 kev. What generally results is the well region 345 having a peak dopant concentration ranging from about 5E17 atoms/cm$^3$ to about 1E19 atoms/cm$^3$.

Figure 4:
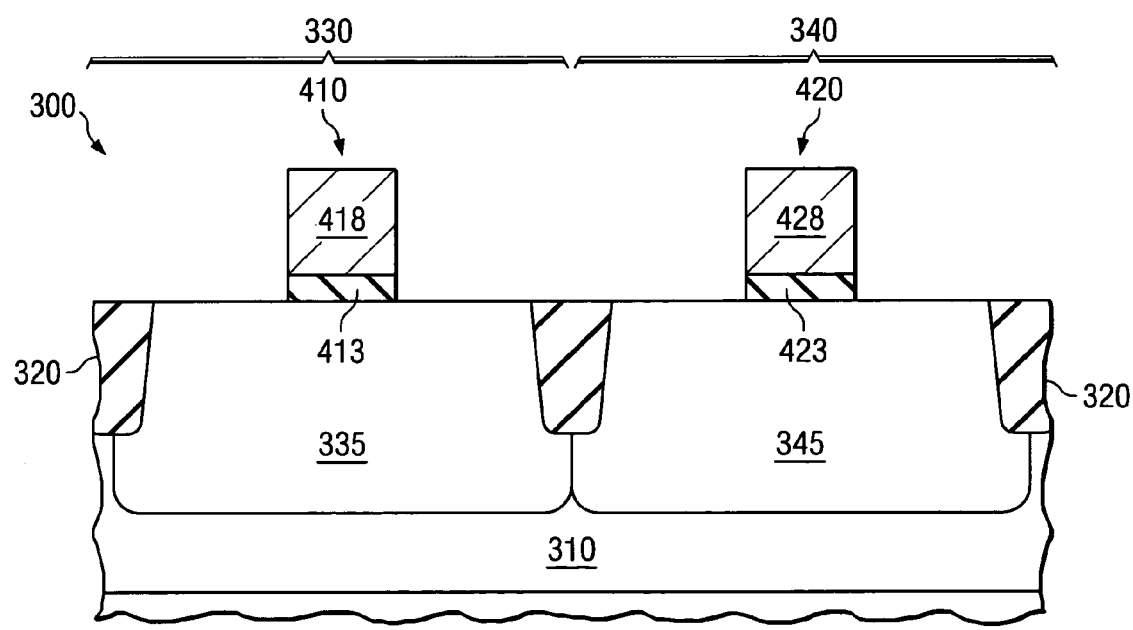
FIG. 4 illustrates a cross-sectional view of the partially completed semiconductor device illustrated in FIG. 3 after formation of conventional gate structures over the substrate.

Turning now to FIG. 4, illustrated is a cross-sectional view of the partially completed semiconductor device 300 illustrated in FIG. 3 after formation of conventional gate structures 410, 420, over the substrate 310. As is illustrated in FIG. 4, the gate structure 410 of the NMOS device 330 includes a gate dielectric layer 413 and a gate electrode layer 418. Similarly, the gate structure 420 of the PMOS device 340 includes a gate dielectric layer 423 and a gate electrode layer 428. As the gate structures 410, 420 are conventional, those skilled in the art understand the standard steps used for their manufacture, including depositing both a blanket layer of gate dielectric material and blanket layer of gate electrode material and subsequently using photolithography to define the gate structures 410, 420.

Figure 5:
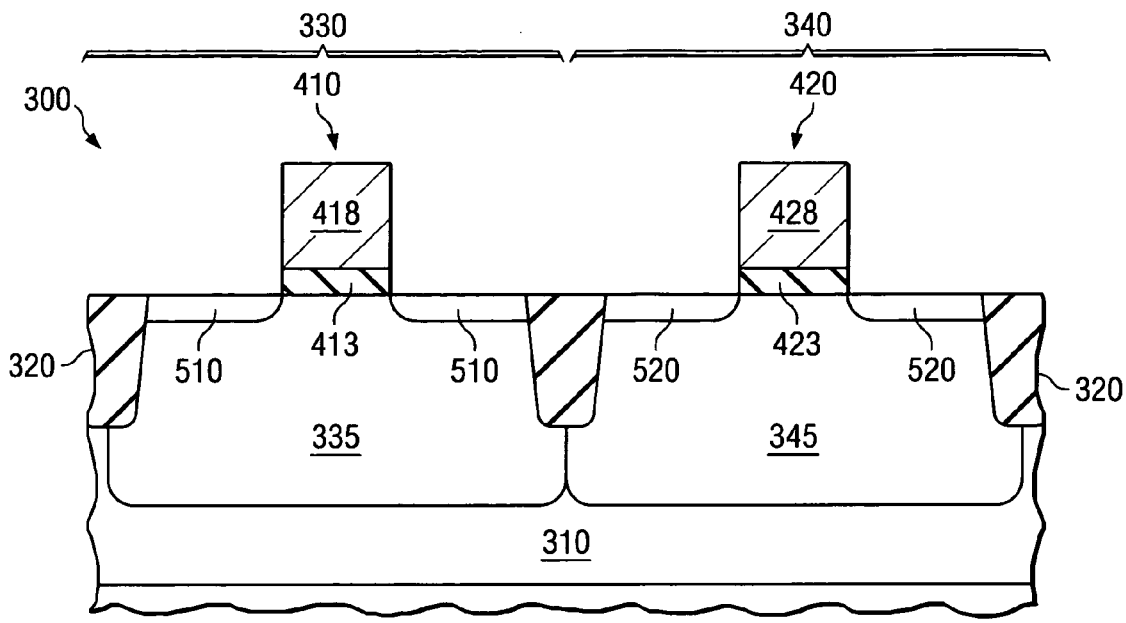
FIG. 5 illustrates a cross-sectional view of the partially completed semiconductor device illustrated in FIG. 4 after formation of source/drain extension implants within the substrate portion of the NMOS device and PMOS device.

Turning now to FIG. 5, illustrated is a cross-sectional view of the partially completed semiconductor device 300 illustrated in FIG. 4 after formation of source/drain extension implants 510, 520, within the substrate 310 portion of the NMOS device 330 and PMOS device 340, respectively. The source/drain extension implants 510, 520 are conventionally formed and generally have a peak dopant concentration ranging from about 1E19 atoms/cm$^3$ to about 2E20 atoms/cm$^3$. As is standard in the industry, the source/drain extension implants 510, 520 have a dopant type opposite to that of the respective well regions 335, 345 they are located within. Accordingly, the source/drain extension implants 510, 520, illustrated in the embodiment shown in FIG. 5 are doped with an n-type dopant and p-type dopant, respectively.

Figure 6:
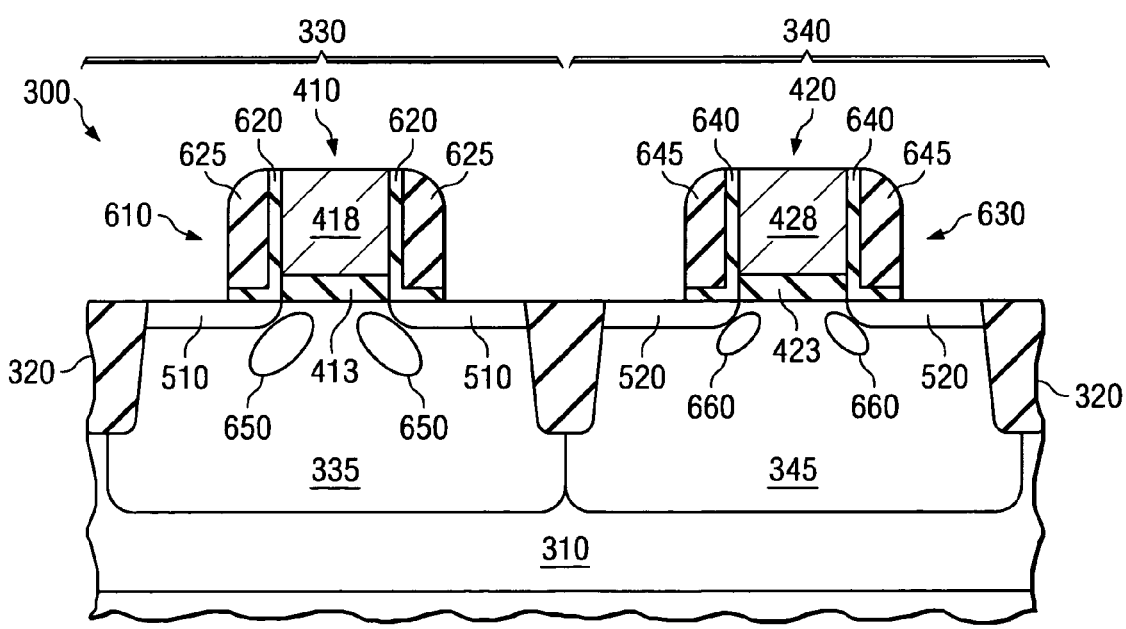
FIG. 6 illustrates a cross-sectional view of the partially completed semiconductor device illustrated in FIG. 5 after forming gate sidewall spacers along one or more sidewalls of the gate structures.

Turning now to FIG. 6 illustrated is a cross-sectional view of the partially completed semiconductor device 300 illustrated in FIG. 5 after forming gate sidewall spacers 610, 630 along one or more sidewalls of the gate structures 410, 420, respectively. The gate sidewall spacer 610, in the embodiment of FIG. 6, includes a thin L-shaped oxide spacer 620 and a bulk nitride spacer 625. Similarly, the gate sidewall spacer 630, in the embodiment of FIG. 6, includes a thin L-shaped oxide spacer 640 and a bulk nitride spacer 645. While the gate sidewall spacers 610, 630 each comprise thin L-shaped oxide spacers 620, 640, and bulk nitride spacers 625, 645, respectively, the present invention is not limited to such. For example, certain embodiments may, while unlikely, exist wherein the gate sidewall spacers 610, 630, only comprise the bulk nitride spacers 625, 645, respectively. Other embodiments may exist wherein the gate sidewall spacers 610, 630 include other different layers or materials in addition to or in place of the bulk nitride spacers 625, 645.

In accordance with the principles of the present invention, the gate sidewall spacers 610, 630, contain 20 atomic percent or more of hydrogen therein. In one exemplary embodiment, the gate sidewall spacers 610, 630, contain from about 25 atomic percent to about 30 atomic percent of hydrogen therein. As previously indicated, the hydrogen may be tailored to provide a specific amount of tensile stress in the channel region of the NMOS device 330. As will be understood further below, the tensile stress in the channel region of the PMOS device 340 may be limited using other inventive processes, including reducing the amount of hydrogen within the gate sidewall spacers 630.

The gate sidewall spacers 610, 630, may be manufactured using various different processes. Nevertheless, one exemplary embodiment of the invention includes conventionally depositing a blanket layer of oxide material over the substrate 310 and along the sidewalls and top of the gate structures 410, 420. Thereafter, a plasma enhanced chemical vapor deposition (PECVD) process may be used to deposit a blanket layer of nitride material over the blanket layer of oxide material. It is this PECVD process that allows the amount of hydrogen within the gate sidewall spacers 610, 630, to be increased and/or tailored.

As the deposition of the blanket layer of oxide material is conventional no further detail is warranted regarding its manufacture. As the PECVD formation of the blanket layer of nitride material is not conventional, details are warranted. In one exemplary embodiment of the present invention, the blanket layer of nitride material is deposited using a PECVD process using a silicon source such as silane ($SiH_4$) and ammonia ($NH_3$), at a pressure ranging from about 4 torr to about 10 torr, with an optimal pressure ranging from about 5 torr to about 7 torr. Additionally, the PECVD process may use an RF power ranging from about 50 watts to about 300 watts, with an optimal RF power ranging from about 150 watts to about 250 watts. Moreover, the PECVD process may be conducted in the presence of a temperature ranging from about 200° C. to about 400° C., or in an exemplary embodiment from about 250° C. to about 350° C. Additionally, the $SiH_4$/$NH_3$ gas ratio is typically about 0.2 to about 0.6, with an optimal ratio of about 0.3 to about 0.5. Helium, nitrogen or argon can be used as the carrier gas for reactive gases.

After completing the formation of the blanket layer of oxide material and the blanket layer of nitride material, the stack of layers may be subjected to an etch to form the gate sidewall spacers 610, 630. In one exemplary embodiment of the present invention, the stack of layers is subjected to an anisotropic etch to form the gate sidewall spacers 610, 630. For example, a standard plasma anisotropic etch could be used to define the gate sidewall spacers 610, 630.

It should be noted that at this point in the manufacturing process, that the gate sidewall spacers 610 and the gate sidewall spacers 630 contain substantially similar, if not identical, amounts of hydrogen therein. Namely, each of the gate sidewall spacers 610, 630 contain 20 atomic percent or more of hydrogen therein. Nevertheless, the "local hydrogen treatment (LHT)" method described herein may be conducted to reduce the amount of hydrogen within the gate sidewall spacers 630 in the PMOS device 340.

Also illustrated in FIG. 6 is the formation of halo/pocket implants 650, 660 within the NMOS device 330 and PMOS device 340, respectively. The halo/pocket implants 650, in the particular embodiment illustrated in FIG. 6, comprise a p-type dopant. For example, in the illustrative embodiment shown in FIG. 6, the halo/pocket implants 650 include boron and have a peak dopant concentration ranging from about $1E18$ atoms/cm$^3$ to about $1E19$ atoms/cm$^3$. Similarly, the halo/pocket implants 660, in the particular embodiment illustrated in FIG. 6, comprise an n-type dopant. For example, in the illustrative embodiment shown in FIG. 6, the halo/pocket implants 660 include phosphorous or arsenic and have a peak dopant concentration ranging from about $1E18$ atoms/cm$^3$ to about $1E19$ atoms/cm$^3$.

Take particular notice of the enlarged halo/pocket implants 650. This is at least partially a result of the high diffusivity of the p-type dopant (e.g., boron) used to form the halo/pocket implants 650. While the particular dopant used and dopant concentration of the halo/pocket implants 650, 660 have been given, those skilled in the art understand that the present invention should not be limited to such dopants and concentrations. The use and location of the halo/pocket implants 650, 660 is particularly designed to reduce short channel effects in the semiconductor device 300.

Figure 7:
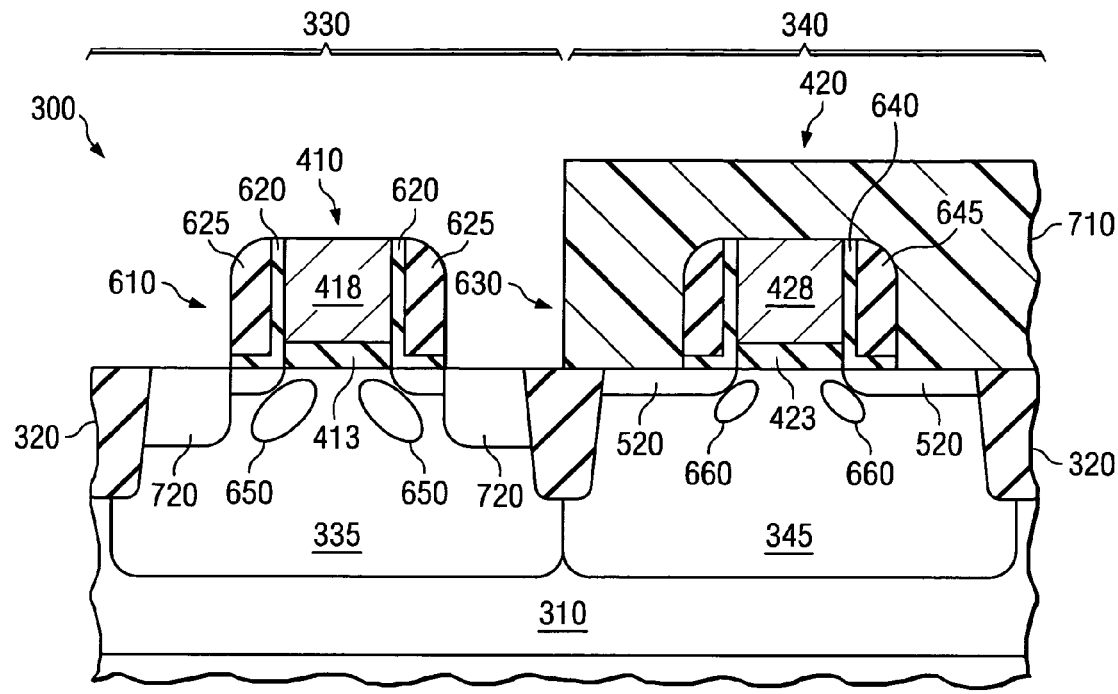
FIG. 7 illustrates a cross-sectional view of the partially completed semiconductor device illustrated in FIG. 6 after formation of a photoresist layer over the PMOS device and forming source/drain implants within the substrate of the NMOS device.

Turning now to FIG. 7, illustrated is a cross-sectional view of the partially completed semiconductor device 300 illustrated in FIG. 6 after formation of a photoresist layer 710 over the PMOS device 340 and forming source/drain implants 720 within the substrate 310 of the NMOS device 330. Those skilled in the art understand the conventional processes that may be used to form and pattern the photoresist layer 710 over the PMOS device 340, thus no additional detail is required.

The source/drain implants 720 are conventionally formed and generally have a peak dopant concentration ranging from about $1E18$ atoms/cm$^3$ to about $1E21$ atoms/cm$^3$. Also, the source/drain implants 720 should typically have a dopant type opposite to that of the well region 335 they are located within. Accordingly, in the illustrative embodiment shown in FIG. 7, the source/drain implants 720 are doped with an n-type dopant.

Figure 8:
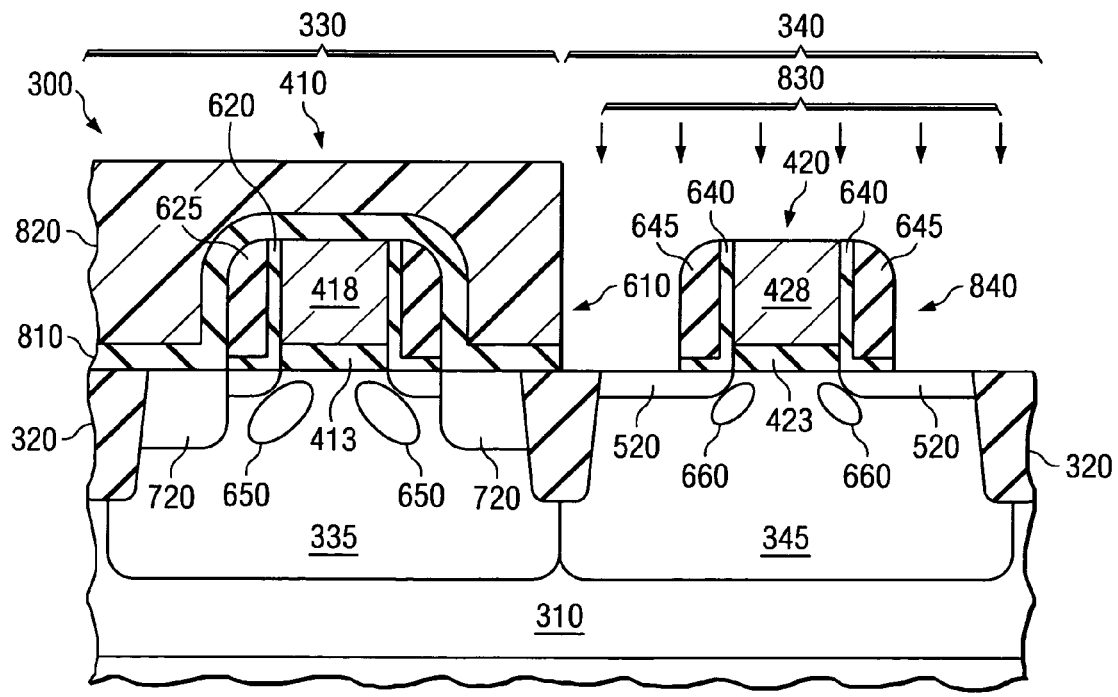
FIG. 8 illustrates a cross-sectional view of the partially completed semiconductor device illustrated in FIG. 7 after forming and patterning both a protective layer and a photoresist layer over the NMOS device, and subjecting the PMOS device to an energy source.

Turning now to FIG. 8, illustrated is a cross-sectional view of the partially completed semiconductor device 300 illustrated in FIG. 7 after forming and patterning both a protective layer 810 and a photoresist layer 820 over the NMOS device 330, and subjecting the PMOS device 340 to an energy source 830. In accordance with the principles of the present invention, the protective layer 810 is formed so as to protect the NMOS device 330 from the energy source 830. For instance, when the energy source 830 is an ultraviolet (UV) energy source, the protective layer 810 may be a UV protective layer, such as a bottom anti reflective coating (BARC) layer. However, if the energy source 830 were another type of energy source 830, such as an electron beam energy source, the protective layer 810 could comprise a different material. In essence, any type of protective layer 810 may be used so long as it protects the NMOS device 330, and more particularly the gate sidewall spacers 610 of the NMOS device 330, from the energy source 830. In addition to the material composition of the protective layer 810, the thickness of the protective layer 810 may also be important to its ability to be a barrier to the energy source 830.

After forming the blanket layer of protective layer 810 over the substrate 310, a blanket layer of photoresist material 820 may be formed over the blanket layer of protective layer 810. Thereafter, the blanket layer of protective layer 810 and blanket layer of photoresist material may be patterned, resulting in the protective layer 810 and photoresist layer 820 illustrated in FIG. 8.

With the protective layer 810 and photoresist layer 820 in place, the PMOS device 340 may be subjected to the energy source 830. As previously indicated, the energy source 830, among others, may comprise a UV energy source. In this embodiment, the UV energy source may have a wavelength ranging from about 100 nm to about 300 nm, with a preferred wavelength ranging from about 140 nm to about 250 nm. Likewise, the PMOS device 340 may be subjected to the UV energy source for a time period ranging from about 1 minute to about 30 minutes, with an exemplary time ranging from about 3 minutes to about 5 minutes. Other conditions outside of the aforementioned ranges may be used, and thus are within the purview of the present invention.

What results after exposing the PMOS device 340 to the energy source 830 are gate sidewall spacers 840. In accordance with the principles of the present invention, the gate sidewall spacers 840 may have an amount of hydrogen less than the gate sidewall spacers 610. For instance, the gate sidewall spacers 830 may have about 15 atomic percent or less of hydrogen therein. In one exemplary embodiment, the gate sidewall spacers 840, and more particularly the bulk nitride spacer 845, have from about 5 to about 10 atomic percent of hydrogen therein.

It is believed that the energy source 830 disassociates the hydrogen bond in the gate sidewall spacers 840 that it contacts. Accordingly, the hydrogen is capable of exiting the gate sidewall spacers 840, resulting in a reduction in the amount of hydrogen therein. In certain instances, which will be discussed further below, an anneal may be required to allow the appropriate amount of hydrogen to leave the gate sidewall spacers 840. The benefits of the difference in hydrogen concentration between NMOS and PMOS sidewall spacers 610, 840, respectively, will be explained later.

Figure 9:
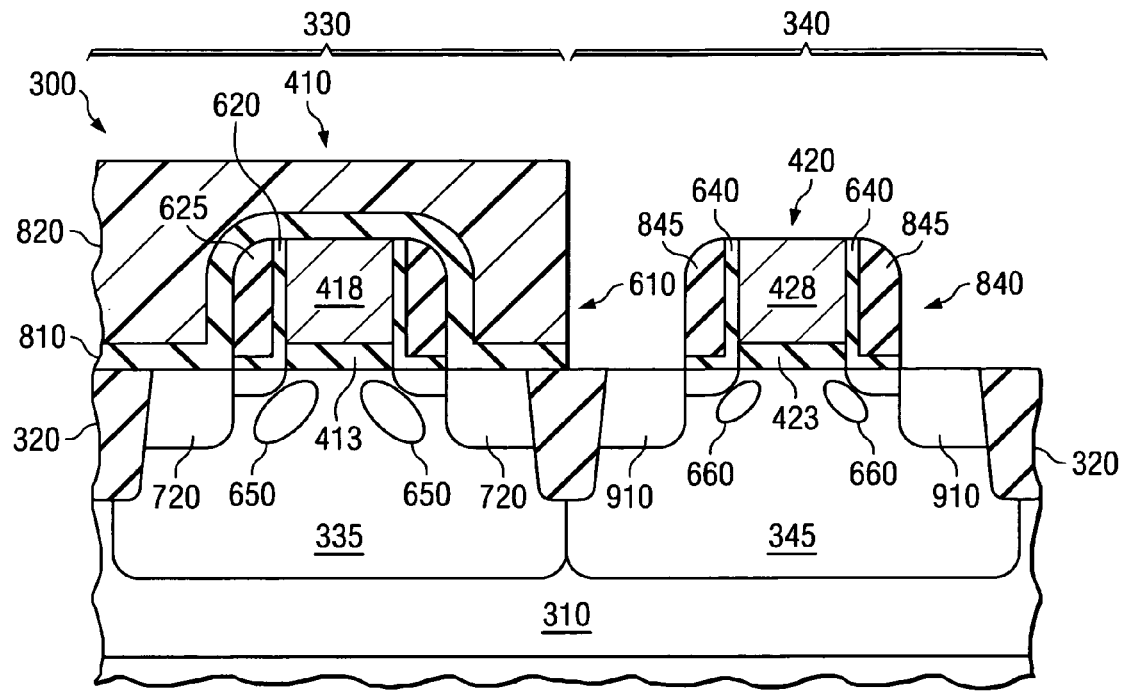
FIG. 9 illustrates a cross-sectional view of the partially completed semiconductor device illustrated in FIG. 8 after forming source/drain implants within the PMOS device.

Turning now to FIG. 9, illustrated is a cross-sectional view of the partially completed semiconductor device 300 illustrated in FIG. 8 after forming source/drain implants 910 within the PMOS device 340. The source/drain implants 910 are conventionally formed and generally have a peak dopant concentration ranging from about 1E18 atoms/cm$^3$ to about 1E21 atoms/cm$^3$. Also, the source/drain implants 910 should typically have a dopant type opposite to that of the well region 345 they are located within. Accordingly, in the illustrative embodiment shown in FIG. 9, the source/drain implants 910 are doped with a p-type dopant, such as boron.

It should be noted that the steps of both FIGS. 8 and 9 use the protection layer 810 and the photoresist layer 820. Accordingly, the steps of FIG. 9 could be performed before the steps of FIG. 8, or vice-versa and shown. Nevertheless, it should also be noted that the steps of FIGS. 8 and 9 could be broken up using different protective layers 810 and photoresist layers 820. However, for the interest of saving steps, time, and expense, the exposure of the PMOS device 340 to the energy source 830 has been incorporated into the traditional process flow for forming the source/drain implants 910. In essence, the only steps added were the formation of the protective layer 810 before the photoresist layer 820, and the exposure of the PMOS device 340 to the energy source 830. Both of these added steps are relatively simple and inexpensive. After the local hydrogen treatment (LHT) and source/drain implants, the photoresist 820 and the protective layer 810 are removed.

Figure 10:
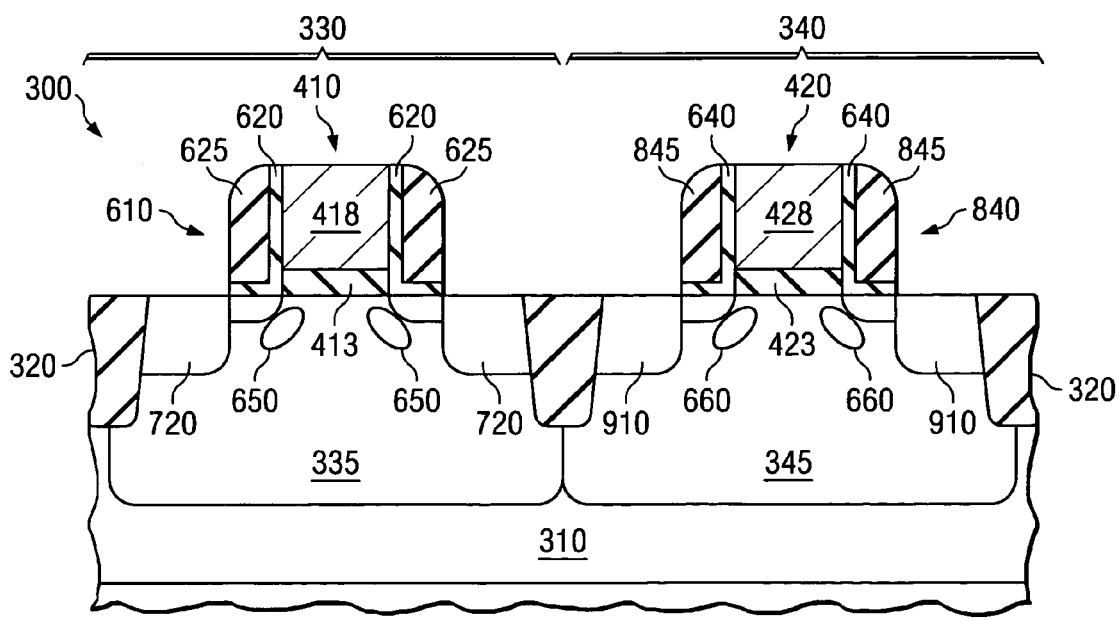
FIG. 10 illustrates a cross-sectional view of the partially completed semiconductor device illustrated in FIG. 9 after subjected the semiconductor device to an anneal.

Turning now to FIG. 10, illustrated is a cross-sectional view of the partially completed semiconductor device 300 illustrated in FIG. 9 after subjected the semiconductor device 300 to an anneal. The anneal time and temperature may vary greatly while staying within the scope of the present invention. Nevertheless, in one embodiment of the present invention the anneal is conducted for a time period ranging from about 1 second to about 3 seconds at a temperature ranging from about 1000° C. to about 1100° C.

The anneal illustrated in FIG. 10 has various purposes. First, the anneal is used to activate the source/drain regions of the NMOS device 330 and PMOS device 340, resulting in structures similar to the source/drain regions 250, 290, illustrated in FIG. 2. Moreover, the anneal assists in the removal of the hydrogen from the gate sidewall spacers 840 that were subjected to the energy source 830.

During the anneal, the difference in the hydrogen concentration in NMOS and PMOS devices provides various benefits. First, the reduced amount of hydrogen limits the change in stress within the gate sidewall spacers 840, thus limiting the tensile stress within the channel region of the PMOS device 340. This advantageously minimizes the degradation in the drive current of the PMOS device 340 while improving the drive current of the NMOS devices. Moreover, the reduction in the amount of hydrogen within the gate sidewall spacers 840 reduces the ability of the hydrogen to draw the boron from the source/drain extension implants 520, and thus reduce the performance of the PMOS device 340. Thus, as the hydrogen content in the gate sidewall spacers 840 remains small, the boron dopant concentration in the source/drain extension implants 520 remains within a range for acceptable parasitic resistance. On the other hand, the high hydrogen concentration in the sidewall spacers 610 around NMOS devices 330 enhances the boron segregation in the boron halo/pocket implants 650. The segregation eliminates the boron pile-up at the interface of the gate dielectric 413 and gate channel and thus forms the so-called "retrograde" dopant profile for improvement in electron mobility.

In addition to its impact on the dopant distribution, the anneal causes the tensile stress in the gate sidewall spacers 610 containing the elevated amount of hydrogen to increase. For example, the increased amount of hydrogen in the gate sidewall spacers 610, as compared to the gate sidewall spacers 840, may cause the change in stress in the gate sidewall spacers 610 to be up to or more than two to three times greater than the that in the gate sidewall spacers 840. As this change in stress ultimately leads to tensile stress in the channel region of the NMOS device 330, the NMOS device 330 experiences increased drive current as a result of the increased amount of hydrogen.

Figure 11:
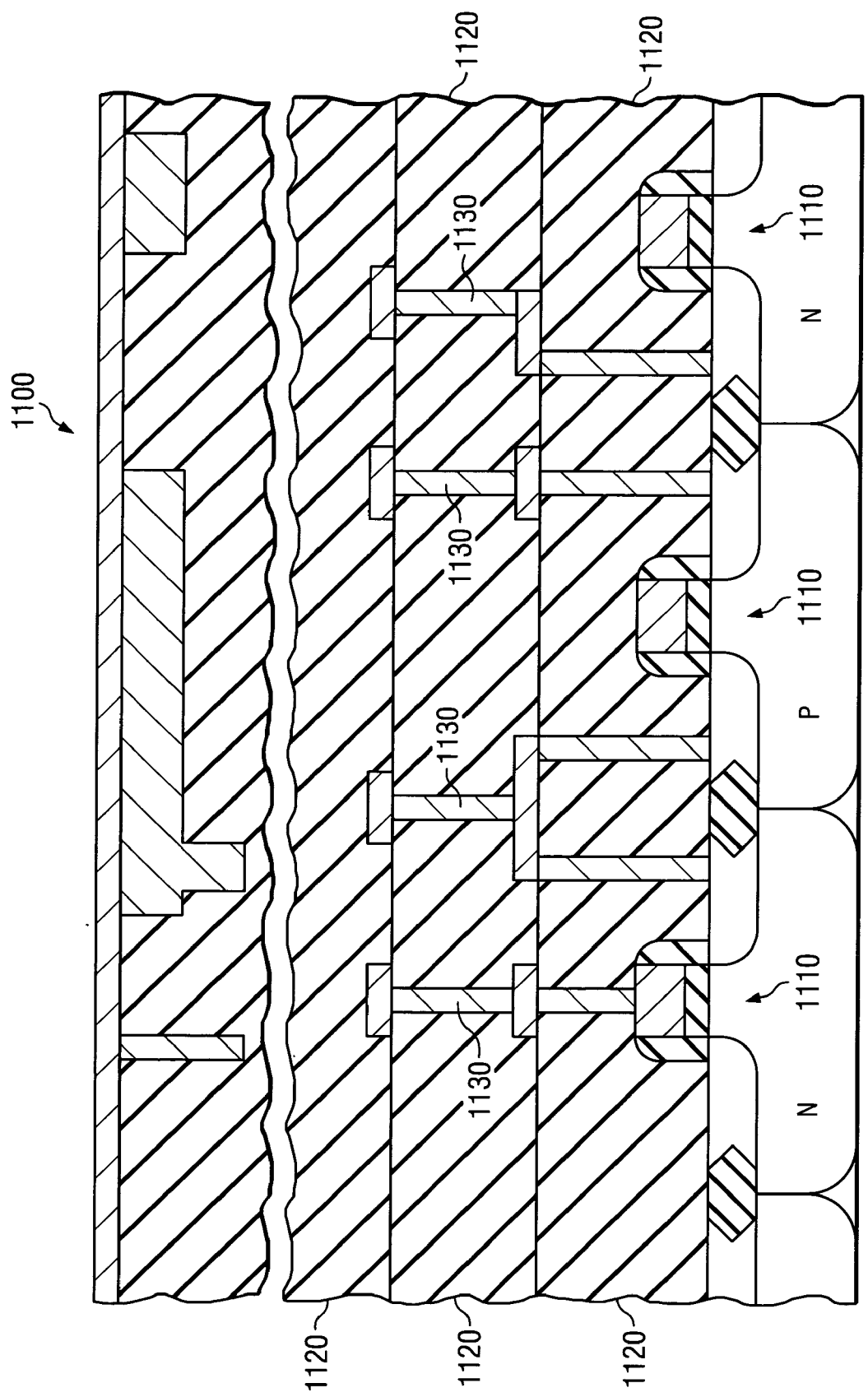
FIG. 11 illustrates an exemplary cross-sectional view of an integrated circuit (IC) incorporating semiconductor devices constructed according to the principles of the present invention.

Referring now to FIG. 11, illustrated is an exemplary cross-sectional view of an integrated circuit (IC) 1100 incorporating semiconductor devices 1110 constructed according to the principles of the present invention. The IC 1100 may include devices, such as transistors used to form CMOS devices, BiCMOS devices, Bipolar devices, as well as capacitors or other types of devices. The IC 1100 may further include passive devices, such as inductors or resistors, or it may also include optical devices or optoelectronic devices. Those skilled in the art are familiar with these various types of devices and their manufacture. In the particular embodiment illustrated in FIG. 11, the IC 1100 includes the semiconductor devices 1110 having dielectric layers 1120 located thereover. Additionally, interconnect structures 1130 are located within the dielectric layers 1120 to interconnect various devices, thus, forming the operational integrated circuit 1100.

Although the present invention has been described in detail, those skilled in the art should understand that they can make various changes, substitutions and alterations herein without departing from the spirit and scope of the invention in its broadest form.

What is claimed is:

1. A method for manufacturing an integrated circuit (IC), the method comprising:

forming a gate oxide layer over at least a portion of a substrate;

forming a gate electrode over the gate oxide layer;

implanting a dopant into the substrate to form a first region and a second region that are separated from one another by a channel region, wherein the gate oxide layer and gate electrode are located between the first and second regions over at least a portion of the channel region;

depositing a nitride film by plasma enhanced chemical vapor deposition (PECVD) over the first region, the second region, and the gate electrode, wherein the nitride film has at least 20 atomic percent of hydrogen, and wherein the nitride film is deposited under tensile stress;

etching the nitride film to from spacers over the substrate that are substantially adjacent to the gate electrode; and annealing the IC to at least transfer the tensile stress and at least a portion of hydrogen to the channel region.

2. The method of claim 1, wherein the steps of forming the gate oxide layer and the gate electrode are performed before the step of implanting the dopant.

3. The method of claim 1, wherein the step of etching is performed before the step of annealing.

4. The method of claim 1, wherein the step of depositing further comprises using a reactive gas of silane ($SiH_4$) and ammonia ($NH_3$) having a gas ratio of silane ($SiH_4$) to ammonia ($NH_3$) of about 0.2 to about 0.6 at a pressure ranging from about 4 ton to about 10 ton, at a radio frequency (RF) power ranging from about 50 watts to about 300 watts, and at a temperature of about 200° C. to about 400° C.

5. The method of claim 1, wherein the nitride film has between about 25 atomic percent to about 30 atomic percent of hydrogen.

6. The method of claim 4, wherein the pressure is between about 5 torr and about 7 torr.

7. The method of claim 6, wherein the RF power is between about 150 watts and about 250 watts.

8. The method of claim 7, wherein the temperature is between about 250° C. to about 350° C.

9. The method of claim 8, wherein the gas ratio is between about 0.3 to about 0.5.

10. The method of claim 9, wherein the step of depositing further comprises using a carrier gas of helium, nitrogen, or argon.

11. A method for manufacturing an integrated circuit (IC), the method comprising:

forming a gate oxide layer over at least a portion of a P-type portion of a substrate;

forming a gate electrode over the gate oxide layer;

implanting a N-type dopant into the P-type portion of the substrate to form a first region and a second region that are separated from one another by a P-type channel region, wherein the oxide layer and gate electrode are located between the first and second regions over at least a portion of the channel region;

depositing a nitride film by PECVD over the first region, the second region, and the gate electrode, wherein the nitride film has at least 20 atomic percent of hydrogen, and wherein the nitride film is deposited under tensile stress;

etching the nitride film to from spacers over the substrate that are substantially adjacent to the gate electrode; and annealing the IC to at least transfer the tensile stress and at least a portion of hydrogen to the channel region.

12. The method of claim 11, wherein the steps of forming the gate oxide layer and the gate electrode are performed before the step of implanting the dopant.

13. The method of claim 11, wherein the step of etching is performed before the step of annealing.

14. The method of claim 11, wherein the step of depositing further comprises using a reactive gas of silane ($SiH_4$) and ammonia ($NH_3$) having a gas ratio of silane ($SiH_4$) to ammonia ($NH_3$) of about 0.2 to about 0.6 at a pressure ranging from about 4 ton to about 10 torr, at a radio frequency (RF) power ranging from about 50 watts to about 300 watts, and at a temperature of about 200° C. to about 400° C.

15. The method of claim 11, wherein the nitride film has between about 25 atomic percent to about 30 atomic percent of hydrogen.

16. The method of claim 14, wherein the pressure is between about 5 torr and about 7 torr.

17. The method of claim 16, wherein the RF power is between about 150 watts and about 250 watts.

18. The method of claim 17, wherein the temperature is between about 250° C. to about 350° C.

19. The method of claim 18, wherein the gas ratio is between about 0.3 to about 0.5.

20. The method of claim 19, wherein the step of depositing further comprises using a carrier gas of helium, nitrogen, or argon.

* * * * *